(12) United States Patent
Nguyen et al.

(10) Patent No.: US 10,349,553 B2
(45) Date of Patent: Jul. 9, 2019

(54) ADJUSTABLE RACK FOR ELECTRONICS CABINET

(71) Applicant: CommScope Technologies LLC, Hickory, NC (US)

(72) Inventors: Tri Nguyen, Richardson, TX (US); Charles J. Mann, Omaha, NE (US)

(73) Assignee: CommScope Technologies LLC, Hickory, NC (US)

( * ) Notice: Subject to any disclaimer, the term of this patent is extended or adjusted under 35 U.S.C. 154(b) by 79 days.

(21) Appl. No.: 15/465,286

(22) Filed: Mar. 21, 2017

(65) Prior Publication Data

US 2017/0280580 A1 Sep. 28, 2017

Related U.S. Application Data

(60) Provisional application No. 62/311,589, filed on Mar. 22, 2016.

(51) Int. Cl.
*H05K 7/14* (2006.01)
*H05K 7/18* (2006.01)

(52) U.S. Cl.
CPC .............. *H05K 7/18* (2013.01); *H05K 7/186* (2013.01)

(58) Field of Classification Search
CPC ................................. H05K 7/18; H05K 7/186
USPC ............................. 211/26; 312/223.1, 223.2
See application file for complete search history.

(56) References Cited

U.S. PATENT DOCUMENTS

| 5,639,150 A * | 6/1997 | Anderson | A47B 96/145 312/265.2 |
|---|---|---|---|
| 2003/0071544 A1* | 4/2003 | Chang | H05K 5/0021 312/107 |
| 2004/0016708 A1* | 1/2004 | Rafferty | H05K 7/1492 211/26 |
| 2004/0201335 A1* | 10/2004 | Davis | G06F 1/181 312/265.3 |
| 2010/0000950 A1* | 1/2010 | Malekmadani | A47B 57/10 211/26 |
| 2011/0043992 A1* | 2/2011 | Peng | A47B 81/068 361/679.31 |
| 2013/0026892 A1* | 1/2013 | Wineland | H05K 7/1489 312/223.2 |
| 2014/0175030 A1* | 6/2014 | Lu | H05K 7/1488 211/26 |
| 2014/0197118 A1* | 7/2014 | Chen | G06F 1/187 211/26 |
| 2017/0295665 A1* | 10/2017 | Mann | H02M 7/125 |

* cited by examiner

*Primary Examiner* — Matthew W Ing
(74) *Attorney, Agent, or Firm* — Myers Bigel, P.A.

(57) ABSTRACT

A rack for an equipment cabinet includes a plurality of rack sections adapted for mounting on an equipment cabinet, each of the rack sections including a vertical panel, a lower horizontal panel extending from a lower edge of the vertical panel, and an upper horizontal panel extending from an upper edge of the vertical panel, the rail sections being vertically stacked.

18 Claims, 7 Drawing Sheets

ADJUSTABLE RACK FOR ELECTRONICS CABINET

RELATED APPLICATION

The present application claims priority from and the benefit of U.S. Provisional Patent Application No. 62/311,589, filed Mar. 22, 2016, the disclosure of which is hereby incorporated herein in its entirety.

FIELD OF THE INVENTION

The present invention relates generally to cabinets, and more specifically to electronics cabinets.

BACKGROUND

Outdoor electronic cabinets have become popular in recent years. They can protect a wide range of electronic equipment including radios, multicarrier power amplifiers (MCPA), power supplies, batteries, and wireless cell site backhaul equipment. These cabinets can protect base station equipment from environmental conditions while minimizing operating expenses and energy consumption.

Typically, outdoor electronic cabinets have racks adjacent their vertical walls for mounting equipment horizontally within the cabinet. Electronic equipment (which may include AC/DC rectifier plants, Radio Baseband units, network routers, Fiber test and management devices, alarm interface components, and current and surge protection devices) is conventionally mounted in standard 19" or 23" width rack structures. It may be desirable to provide rack configurations that enhance flexibility of mounting equipment within the cabinet.

SUMMARY

As a first aspect, embodiments of the invention are directed to a rack for an equipment cabinet. The rack comprises a plurality of rack sections adapted for mounting on an equipment cabinet. Each of the rack sections includes a vertical panel, a lower horizontal panel extending from a lower edge of the vertical panel, and an upper horizontal panel extending from an upper edge of the vertical panel, the rack sections being vertically stacked.

As a second aspect, embodiments of the invention are directed to an equipment cabinet, comprising: a cabinet enclosure having two opposed side walls; a first rack mounted to one of the side walls; a vertical rail mounted to the other of the side walls; and a second rack mounted to the vertical rail and comprising a plurality of rack sections, each of the rack sections including a vertical panel, a lower horizontal panel extending from a lower edge of the vertical panel, and an upper horizontal panel extending from an upper edge of the vertical panel, the rack sections being vertically stacked.

As a third aspect, embodiments of the invention are directed to an equipment cabinet, comprising: a cabinet enclosure having two opposed side walls; a first rack mounted to one of the side walls; a vertical rail mounted to the other of the side walls; and a second rack mounted to the vertical rail and comprising a plurality of rack sections, each of the rack sections including a vertical panel, a lower horizontal panel extending from a lower edge of the vertical panel, and an upper horizontal panel extending from an upper edge of the vertical panel, the rack sections being vertically stacked. The rack sections are arranged so that a piece of electronic equipment can be mounted vertically between the vertical panel of one of the rack sections and the vertical rail.

DETAILED DESCRIPTION

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 1:
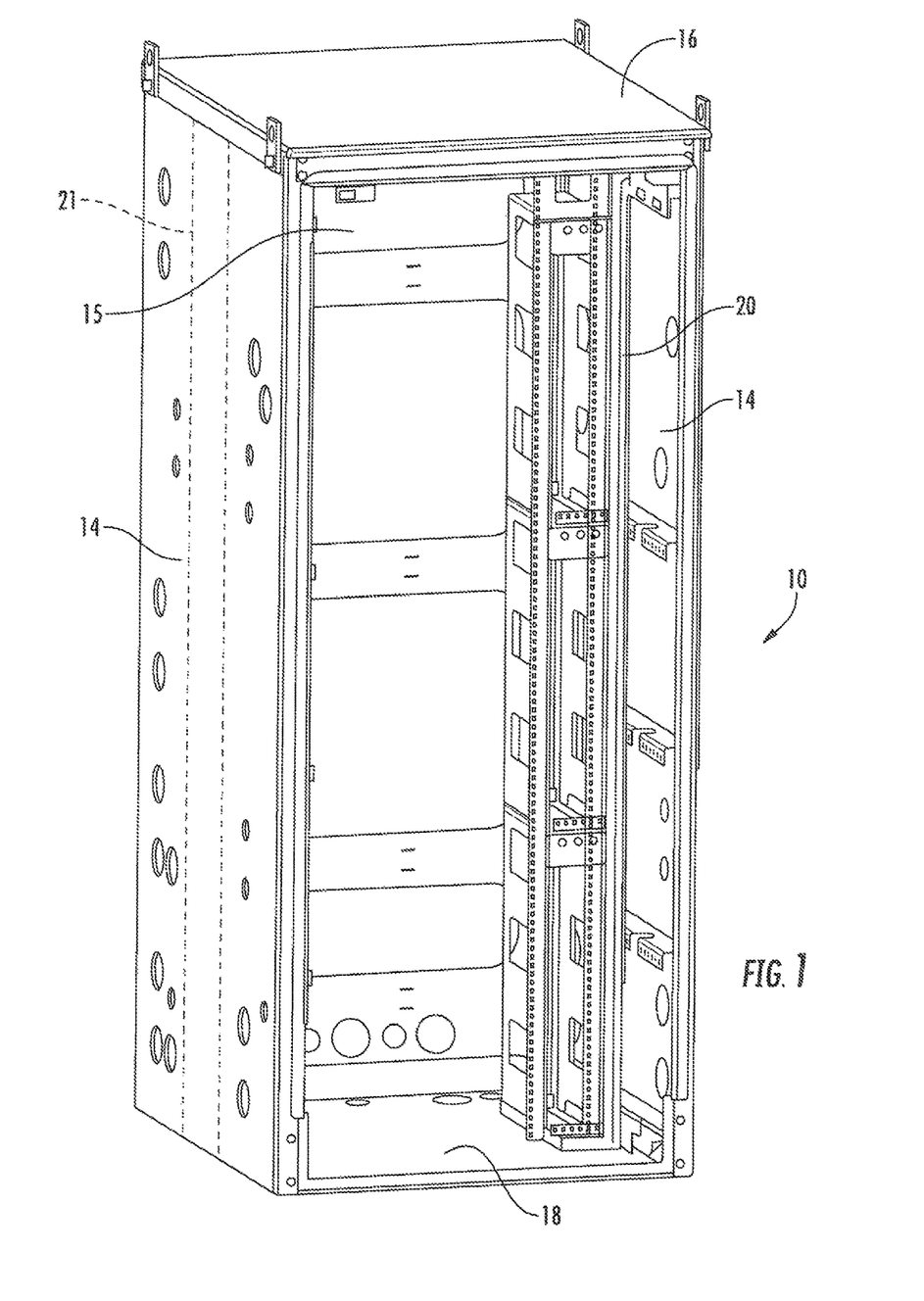
FIG. 1 is a perspective view of a cabinet according to embodiments of the invention.

Referring now to the figures, an electronics cabinet, designated broadly at 10, is shown in FIG. 1. The cabinet 10 is generally box-shaped, with a front wall (not shown), side walls 14, a rear wall 15, a ceiling 16, and a floor 18. The cabinet 10 may be of conventional construction and need not be described in detail herein. A vertical rail 20 (also seen in FIGS. 3-5) is mounted to one of the side walls 14. An opposed vertical side rail 21 is mounted on the opposite side wall 14. The vertical rails 20 are positioned to provide mounting locations in nominal 19" and 23" widths. The front wall 12 is typically positioned between about 18 and 28 inches from the rear wall 15. The cabinet 10 is typically between about 60 and 84 inches in height.

Figure 2:
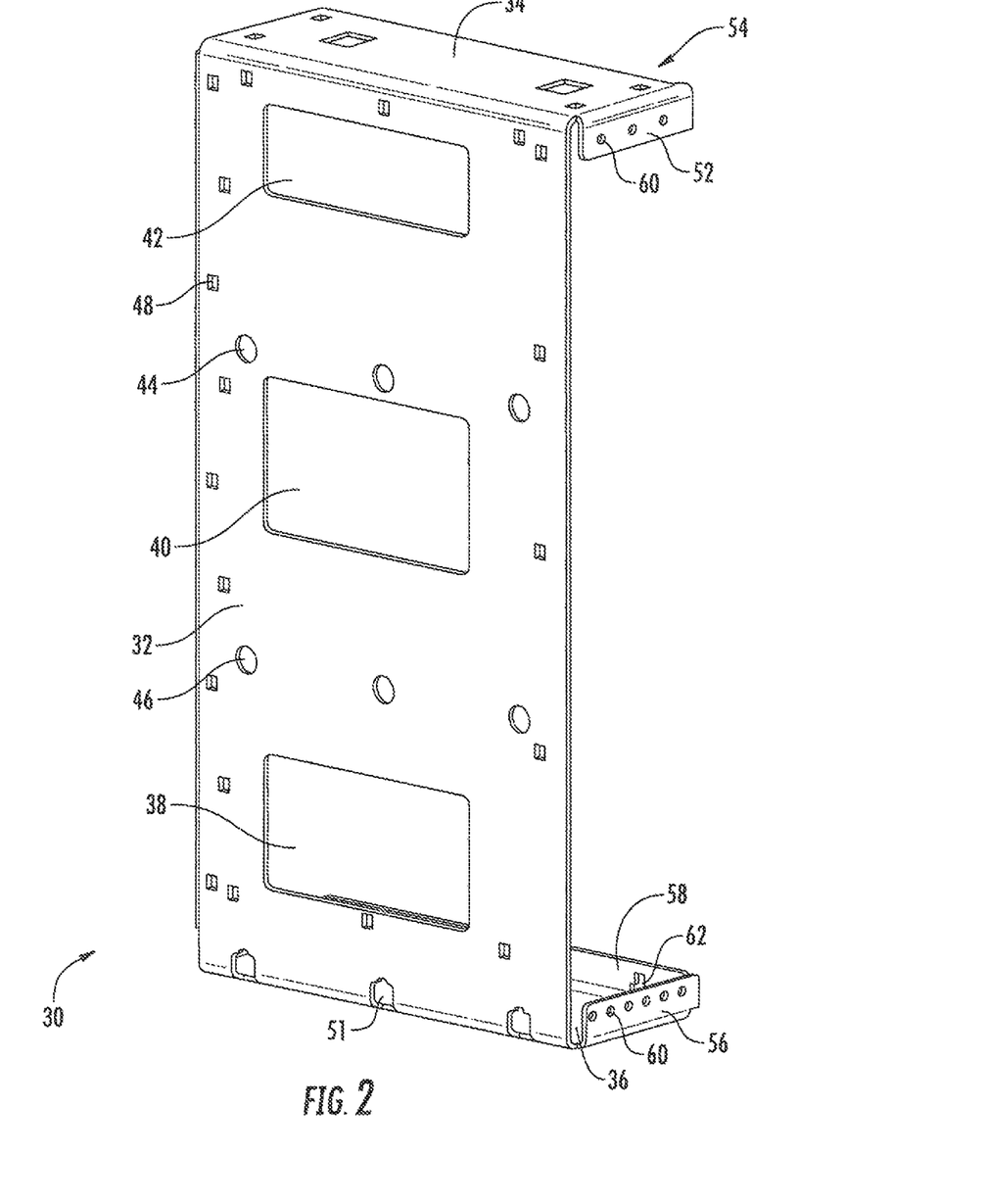
FIG. 2 is a perspective view of a section of a rack for the cabinet of FIG. 1.

Referring now to FIG. 2, a section of a mounting rack, designated broadly at 30, is shown therein. The rack section 30 is generally C-shaped, with a vertical panel 32, an upper horizontal panel 34, and a lower horizontal panel 36. The vertical panel 32 includes three rectangular access windows 38, 40, 42, and further includes upper and lower rows of access holes 44, 46. Additional mounting holes 48 are located about the periphery of the vertical panel 32 to provide locations for mounting brackets 70 (discussed below) and the like. Holes 51 are located at the lower end of the vertical panel 32 for mounting the rack section 30 to the vertical rail 20.

The upper horizontal panel 34 includes side flanges 52 extending downwardly from each side edge of the upper horizontal panel 34, and a front flange 54 extending downwardly from the edge of the upper horizontal panel 34 opposite the vertical panel 32. Similarly, side flanges 56 extend upwardly from each side edge of the lower horizontal panel 36 and a front flange 58 extends upwardly from the free edge of the lower horizontal panel 36. Holes 60 are present in the side flanges 52, 56 for mounting of the mounting bracket 70, and holes 62 are present in the front flanges 58 for mounting to the vertical panel 20.

In some embodiments, the vertical panel 32 is between about 10 and 25 inches in height, and may be in even increments of standard vertical rack units (1.75" per rack unit). They may also be sized to create a vertical distance that accommodates standard 19" or 23" rack mount space between the side flanges 52, 56). Also, the upper and lower horizontal panels 34, 36 may be between about 3.5 and 7.0 inches in width (i.e., from the vertical panel 32 to the front flanges 54, 58). Again, these flange widths may be in increments of 1.75", to accommodate standard rack unit width devices.

Figure 3:
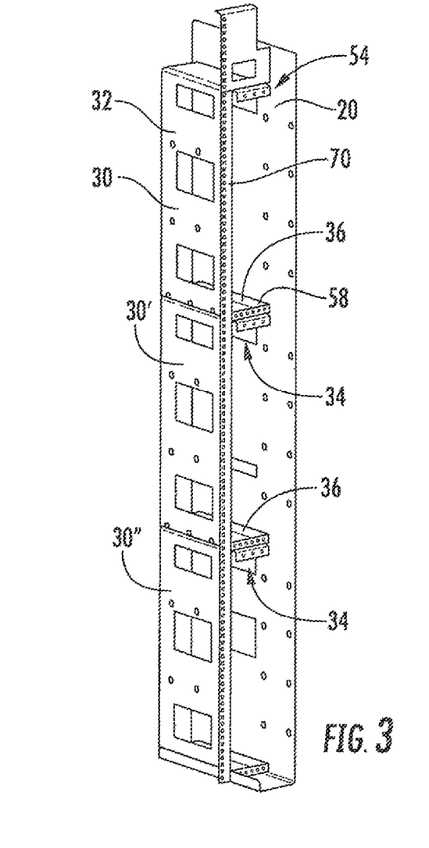
FIG. 3 is a perspective view of three rack sections of FIG. 2 assembled to a cabinet wall in a 19 inch configuration.
Figure 4:
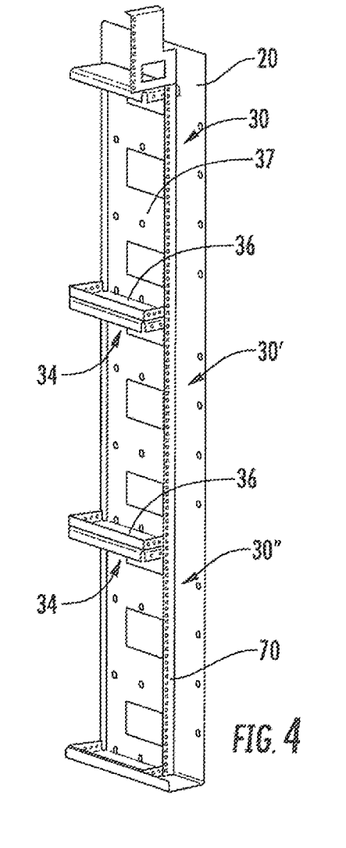
FIG. 4 is a perspective view of three rack sections of FIG. 2 assembled to a cabinet wall in a 23 inch configuration.
Figure 5:
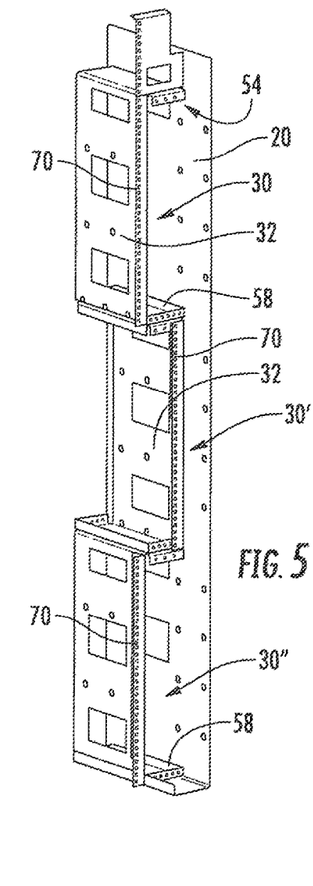
FIG. 5 is a perspective view of three rack sections of FIG. 2 assembled to a cabinet wall in a configuration that is 19 inches at the top and bottom and 23 inches in the center.

As can be seen in FIGS. 3-5, multiple rack sections 30 can be assembled in a manner that enables either 19" or 23" equipment to be mounted within the same cabinet. Referring first to FIG. 3, three rack sections 30, 30', 30" are mounted to the vertical rail 20 on the side wall 14 of the cabinet 10 in an orientation in which the vertical panels 32 are spaced from the vertical rail 20 and the front flanges 54, 58 are adjacent the vertical rail 20. The lower horizontal panel 36 of the rack section 30 abuts the upper horizontal panel 34 of the rack section 30'; similarly, the lower horizontal panel 36 of the rack section 30' abuts the upper horizontal panel 34 of the rack section 30". L-shaped mounting brackets 70 are then mounted to the vertical panels 32 via the mounting holes 48 and provide mounting locations for equipment. In this configuration, the rack sections 30, 30', 30" provide mounting locations for 19" equipment.

In FIG. 4, three rack sections 30, 30' 30" are mounted to the vertical rail 20 on the side wall 14 in an orientation in which the vertical panels 32 are adjacent the vertical rail 20 and the front flanges 54, 58 are spaced therefrom. Once again, the lower horizontal panel 36 of the rack section 30 abuts the upper horizontal panel 34 of the rack section 30', and the lower horizontal panel 36 of the rack section 30' abuts the upper horizontal panel 34 of the rack section 30". In this configuration, the rail sections 30, 30', 30" (via the mounting brackets 70) provide mounting locations for 23" equipment.

In FIG. 5, the top and bottom rack sections 30, 30" are mounted for 19" equipment as in FIG. 3, with the front flanges 54, 58 adjacent the vertical rail 20, but the center rack section 30' is mounted for 23" equipment as in FIG. 4, with the vertical panel 32 adjacent the vertical rail 20. Mounting brackets 70 are mounted accordingly. Other configurations are also possible. Thus, it can be seen that the ability of the rack sections 30, 30', 30" to be mounted independently can provide the cabinet 10 with the flexibility for mounting either 19" or 23" equipment in a variety of arrangements within the same cabinet as desired by the installer.

Figure 6A:
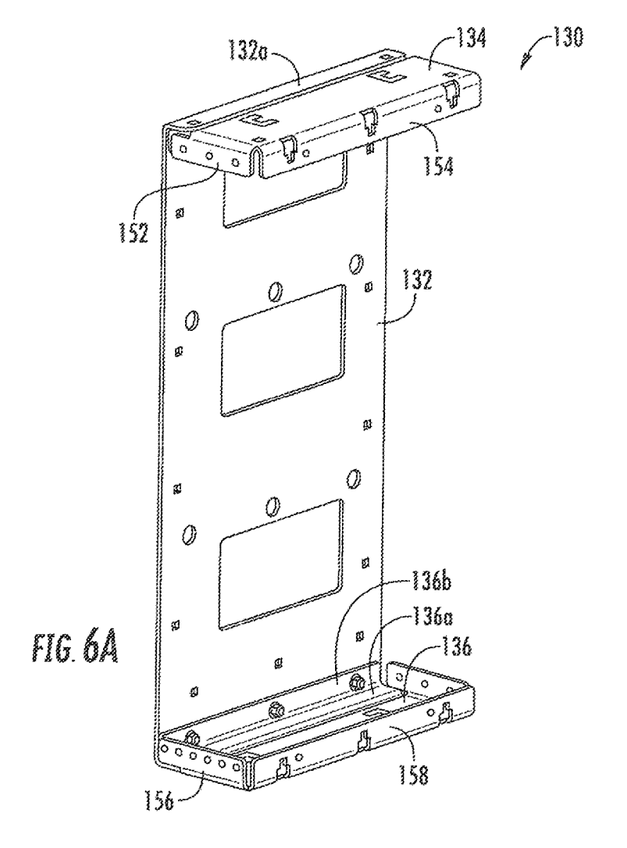
FIGS. 6A and 6B are perspective views of a section of a rack for the cabinet of FIG. 1 according to alternative embodiments of the invention.
Figure 6B:
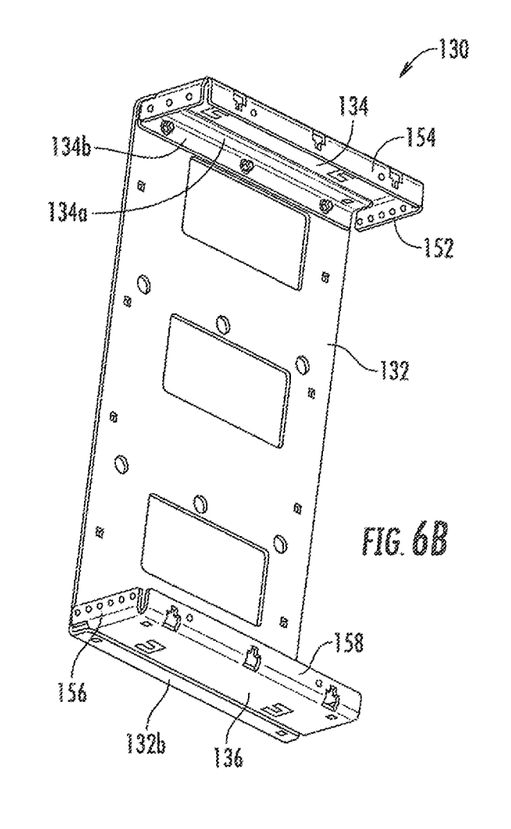

Referring now to FIGS. 6A and 6B, an alternative embodiment of a rack section, designated broadly at 130, is shown therein. The rack section 130 has the same general shape as the rack section 30 described above, but large portions of the upper and lower horizontal panels 134, 136 are formed of separate adapter panels. More specifically, the vertical panel 132 is very similar to the vertical panel 32. Short flanges 132a, 132b extend from the upper and lower ends of the vertical panel 132. The upper and lower adapter panels 134, 136 are attached to the flanges 132a, 132b and extend horizontally therefrom. Each of the upper and lower panels 134, 136 has a respective front flange 154, 158 and respective side flanges 152, 156. Also, each of the upper and lower panels 134, 136 has a respective offset portion 134a, 136a that abuts one of the flanges 132a, 132b of the vertical panel 132, and a rear flange 134b, 136b that extends perpendicular to the offset portion 134a, 136a. The adapter panels 134, 136 are attached to the flanges 132a, 132b of the vertical panel 132 via screws or other fasteners inserted through the rear flanges 134b, 136b.

Figure 7:
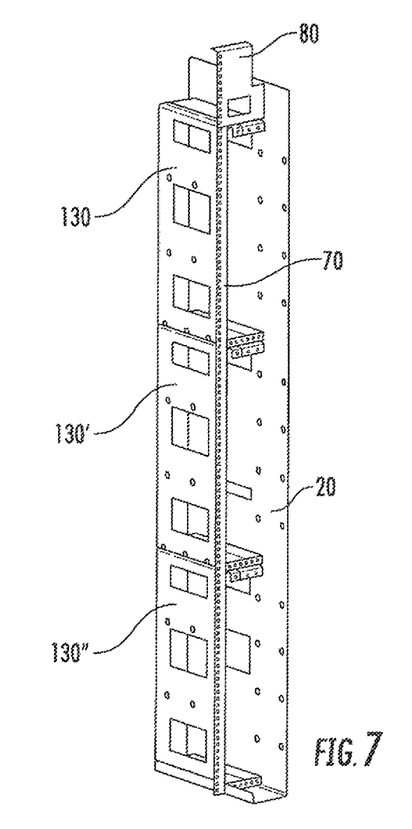
FIG. 7 is a perspective view of three rack sections of FIG. 6 assembled to a cabinet wall in a 19 inch configuration.
Figure 7A:
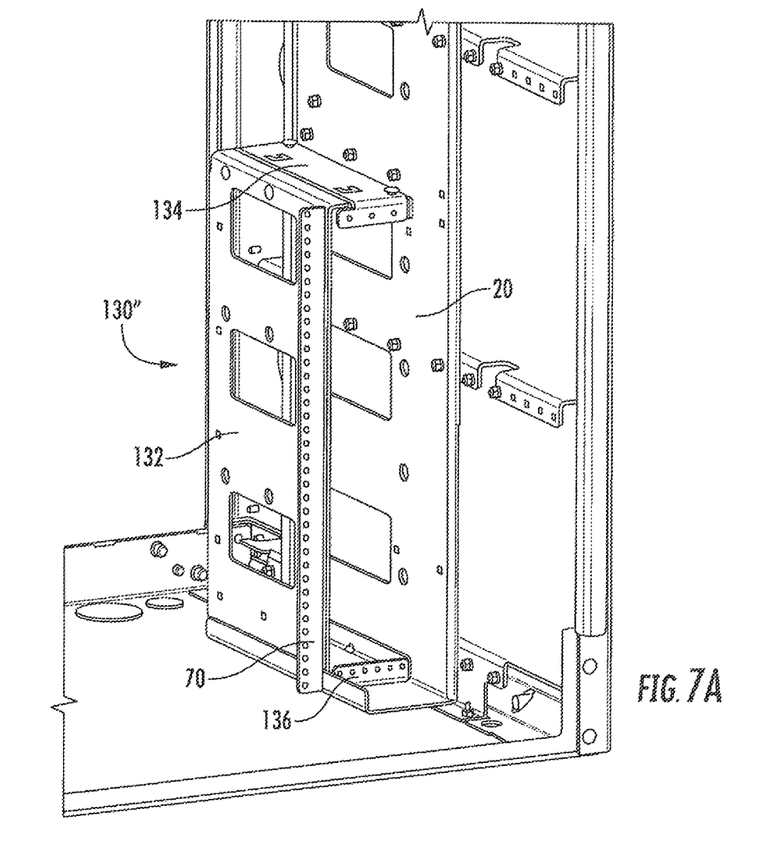
FIG. 7A is an enlarged view of one rack section of FIG. 7 mounted to the vertical rail.
Figure 8:
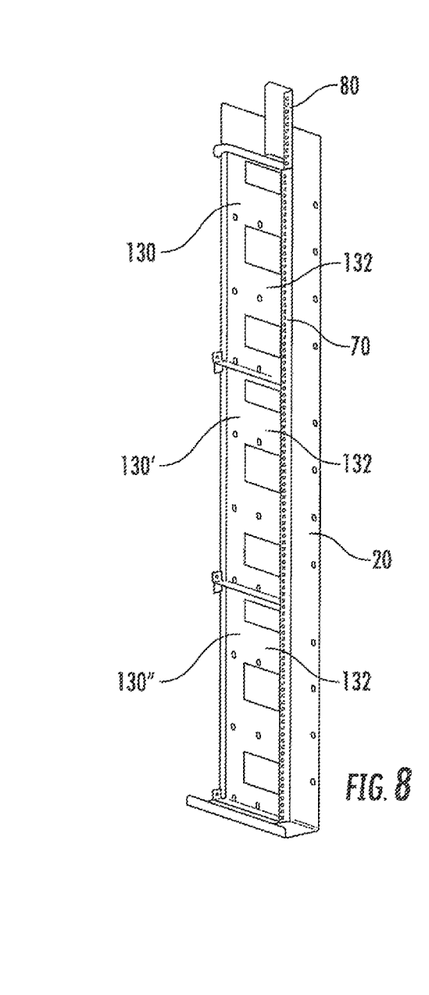
FIG. 8 is a perspective view of three rack sections of FIG. 6 assembled to a cabinet wall in a 23 inch configuration.
Figure 8A:
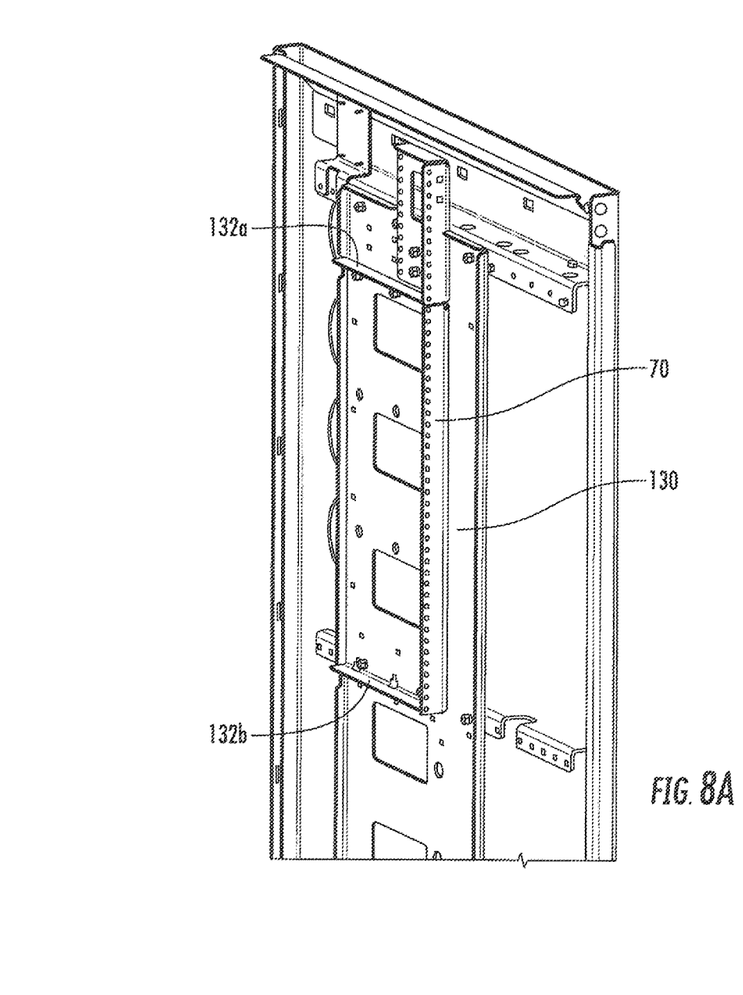
FIG. 8A is an enlarged view of one rack section of FIG. 8 mounted to the vertical rail.
Figure 9:
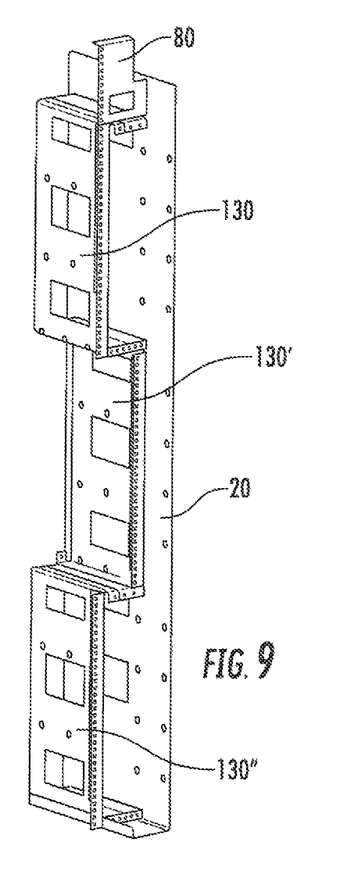
FIG. 9 is a perspective view of three rack sections of FIG. 6 assembled to a cabinet wall in a configuration that is 19 inches at the top and bottom and 23 inches in the center.

As can be seen in FIGS. 7-9, three rack sections 130, 130', 130" can be arranged to provide mounting locations for 19" equipment (FIGS. 7 and 7A), 23" equipment (FIGS. 8 and 8A), or both (FIG. 9). For 19" equipment, the rack sections 130, 130', 130" are bolted to the vertical rail 20 and received the vertical mounting bracket 70 in a manner much like that of the rack sections 30, 30', 30" of FIG. 3 (see FIGS. 7 and 7A). However, as shown in FIGS. 8 and 8A, when 23" equipment is to be mounted, only the vertical panels 132 are mounted to the vertical rail 20, as there is no need for the adapter panels 134, 136. As shown in FIG. 9, when both 19" and 23" equipment is to be mounted, only one adapter panel 134 is needed for the transition between 19" and 23" mounting rack sections. Thus, the use of the separate upper and lower adapter panels 134, 136 enables this arrangement to provide more vertical space between the vertical panels 132 and the vertical rack 20 of the cabinet 10. In particular, this space may be employed to mount 19" equipment vertically between the vertical panels 132 and the vertical rack 20.

In addition, FIGS. 7-9 illustrate a spacer bracket 80 that is mounted above the rack section 130. The spacer bracket 80 (which is typically about 4 to 8 inches in height) provides an additional mounting location for either 19" or 23" equipment.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

That which is claimed is:

1. A rack for an equipment cabinet, comprising:
a plurality of rack sections adapted for mounting on an equipment cabinet, each of the rack sections including a vertical panel, a lower horizontal panel extending from a lower edge of the vertical panel, and an upper horizontal panel extending from an upper edge of the vertical panel, the rack sections being vertically stacked;
wherein the rack sections are arranged so that at least one vertical panel is horizontally offset from at least one other vertical panel.

2. The rack defined in claim 1, wherein each of the rack sections comprises a monolithic component.

3. The rack defined in claim 1, wherein the lower and upper horizontal panels are adapter panels that are detachable from the vertical panel.

4. The rack defined in claim 3, wherein in the vertically stacked configuration, the upper horizontal panel of one rack section serves as the lower horizontal panel of an immediately upwardly adjacent rack section.

5. The rack defined in claim 3, wherein each of the adapter panels includes an offset portion that overlies a flange extending from the vertical panel.

6. The rack defined in claim 1, wherein each of the lower and upper horizontal panels includes side flanges and a front flange.

7. The rack defined in claim 1, further comprising a vertical rail, wherein the rack sections are mounted to the vertical rail.

8. The rack defined in claim 1, further comprising a vertical mounting bracket attached to the rack sections, the vertical mounting bracket configured for mounting of electronic equipment.

9. An equipment cabinet, comprising:
a cabinet enclosure having two opposed side walls;
a first rack mounted to one of the side walls;
a vertical rail mounted to the other of the side walls; and
a second rack mounted to the vertical rail and comprising a plurality of rack sections, each of the rack sections including a vertical panel, a lower horizontal panel extending from a lower edge of the vertical panel, and an upper horizontal panel extending from an upper edge of the vertical panel, the rack sections being vertically stacked.

10. The cabinet defined in claim 9, wherein each of the rack sections comprises a monolithic component, such that an upper panel of one rack section underlies a lower panel of an immediately upwardly adjacent rack section.

11. The cabinet defined in claim 9, wherein the lower and upper horizontal panels are adapter panels that are detachable from the vertical panel.

12. The cabinet defined in claim 11, wherein in a vertically stacked configuration, the upper horizontal panel of one rack section serves as the lower horizontal panel of an immediately upwardly adjacent rail section.

13. The cabinet defined in claim 9, wherein the rack sections are arranged so that the vertical panels are generally coplanar.

14. The cabinet defined in claim 9, wherein the rack sections are mounted with their vertical panels adjacent the vertical rail of the cabinet, such that the rack sections are positioned to mount 23 inch equipment.

15. The cabinet defined in claim 9, wherein the vertical panels are mounted with their vertical panels spaced from the vertical rail of the cabinet, with the upper and lower panels between the side wall and the vertical panels, such that the rack sections are positioned to mount 19 inch equipment.

16. The cabinet defined in claim 9, wherein the rack sections are arranged so that at least one vertical panel is horizontally offset from at least one other vertical panel, such that at least one rack section is positioned to mount 19 inch equipment and at least one other rack section is positioned to mount 23 inch equipment.

17. The cabinet defined in claim 9, further comprising a vertical mounting bracket attached to the rack sections, the vertical mounting bracket configured for mounting of electronic equipment.

18. An equipment cabinet, comprising:
a cabinet enclosure having two opposed side walls;
a first rack mounted to one of the side walls;
a vertical rail mounted to the other of the side walls; and
a second rack mounted to the vertical rail and comprising a plurality of rack sections, each of the rack sections including a vertical panel, a lower horizontal panel extending from a lower edge of the vertical panel, and an upper horizontal panel extending from an upper edge of the vertical panel, the rack sections being vertically stacked;
wherein the rack sections are arranged so that a piece of electronic equipment can be mounted vertically between the vertical panel of one of the rack sections and the vertical rail.

* * * * *